US012701853B2

(12) United States Patent
Koo

(10) Patent No.: US 12,701,853 B2
(45) Date of Patent: Aug. 4, 2026

(54) SEMICONDUCTOR DEVICE INCLUDING RESISTANCE CHANGE LAYER WITH METAL-ORGANIC FRAMEWORK

(71) Applicant: SK hynix Inc., Icheon-si (KR)

(72) Inventor: Won Tae Koo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 605 days.

(21) Appl. No.: 18/315,381

(22) Filed: May 10, 2023

(65) Prior Publication Data

US 2024/0179926 A1 May 30, 2024

(30) Foreign Application Priority Data

Nov. 29, 2022 (KR) ......................... 10-2022-0163461

(51) Int. Cl.
*H10K 10/50* (2023.01)
*G11C 13/00* (2006.01)
*H10B 63/00* (2023.01)
*H10K 10/82* (2023.01)

(52) U.S. Cl.
CPC ......... *H10K 10/50* (2023.02); *G11C 13/0014* (2013.01); *G11C 13/0069* (2013.01); *H10B 63/20* (2023.02); *H10K 10/82* (2023.02); *G11C 2213/72* (2013.01)

(58) Field of Classification Search
CPC ........................ G11C 13/0014; H10N 70/8416
See application file for complete search history.

(56) References Cited

U.S. PATENT DOCUMENTS

| | | | |
|---|---|---|---|
| 9,711,743 B1 | 7/2017 | Allendorf et al. | |
| 2016/0336619 A1 | 11/2016 | Choi et al. | |
| 2020/0235163 A1* | 7/2020 | Karpov | ................. H10B 63/80 |

FOREIGN PATENT DOCUMENTS

KR           102539290 B1 * 6/2023 ........... H10N 70/245

OTHER PUBLICATIONS

Oh et al., Resistive Memory Devices Based on Reticular Materials for Electrical Information Storage, ACS Appl. Mater. Interfaces 2021, 13, 56777-56792 (Year: 2021).*
Tran et al., C-AFM study on multi-resistive switching modes observed in metal-organic frameworks thin films, Organic Electronics 93 (2021) 106136 (Year: 2021).*

* cited by examiner

*Primary Examiner* — Shih Tsun A Chou

(57) ABSTRACT

A semiconductor device includes a first electrode and a second electrode that are spaced apart from each other, and a resistance change layer disposed between the first and second electrodes and including a metal-organic framework having cavities. The resistance change layer includes channels disposed in the cavities, receiving metal ions provided from one electrode of the first and second electrodes.

20 Claims, 10 Drawing Sheets

SEMICONDUCTOR DEVICE INCLUDING RESISTANCE CHANGE LAYER WITH METAL-ORGANIC FRAMEWORK

CROSS-REFERENCE TO RELATED APPLICATIONS

The present application claims priority under 35 U.S.C. § 119(a) to Korean Application No. 10-2022-0163461, filed on Nov. 29, 2022 in the Korean Intellectual Property Office, which is incorporated herein by reference in its entirety.

BACKGROUND

1. Technical Field

The present disclosure generally relates to a semiconductor device including a resistance change layer and, more particularly, to a semiconductor device including a resistance change layer with a metal-organic framework.

2. Related Art

In general, a resistance change material may refer to a material whose electrical resistance changes when an external stimulus such as heat, current, voltage, or light is applied. The resistance change material may maintain a changed electrical resistance even after the external stimulus is removed. The resistance change memory device utilizes the change in electrical resistance of the resistance change material to store signal information.

The resistance change memory device may switch between a low resistance state and a high resistance state by a set operation and a reset operation. According to factors involved in the switching operations, the resistance change memory device may be classified into a resistive RAM, a phase change RAM, a magnetic RAM, and the like. Among them, the resistive memory (resistive RAM) may implement different resistance states through a method of generating or blocking a low resistance electrical path within a resistance change layer by applying a voltage or current to both ends of the resistance change layer.

SUMMARY

A semiconductor device according to an embodiment of the present disclosure may include a first electrode and a second electrode that are spaced apart from each other, and a resistance change layer disposed between the first and second electrodes and including a metal-organic framework having cavities. The resistance change layer may include channels disposed in the cavities, receiving metal ions provided from one electrode of the first and second electrodes.

A semiconductor device according to another embodiment of the present disclosure may include first and second conductive lines that are disposed on different planes, and a pillar structure disposed in a region where the first and second conductive lines intersect and including a first electrode, a resistance change layer including metal-organic frameworks having cavities, and a second electrode. The resistance change layer may include channels disposed in the cavities, receiving metal ions provided from one electrode of the first and second electrodes.

BRIEF DESCRIPTION OF THE DRAWINGS

FIG. 1 is a schematic view schematically illustrating a metal-organic framework according to an embodiment of the present disclosure.

DETAILED DESCRIPTION

Figure 2:
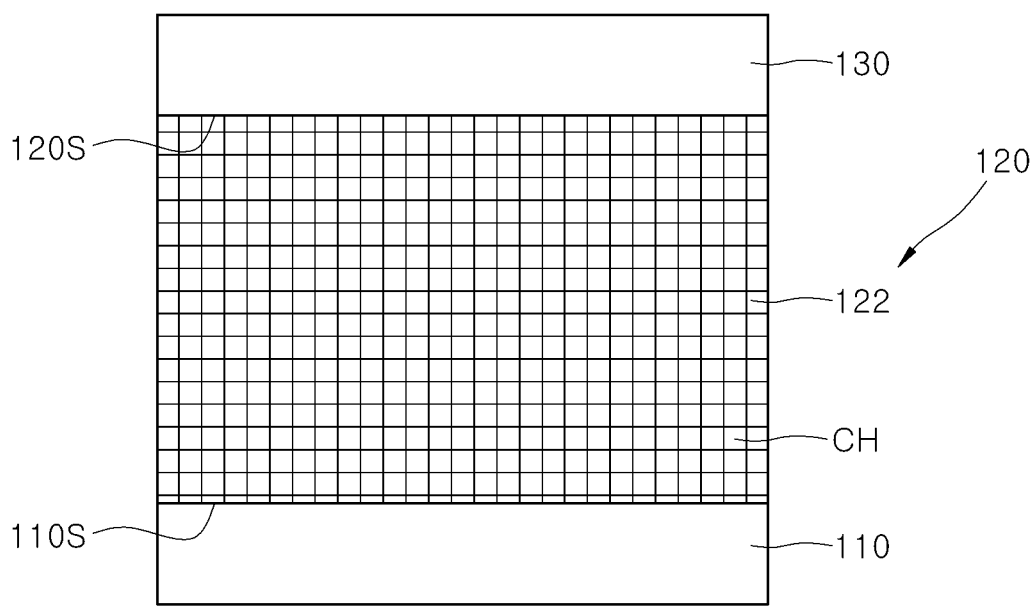
FIG. 2 is a cross-sectional view schematically illustrating a semiconductor device according to an embodiment of the present disclosure.
Figure 2:
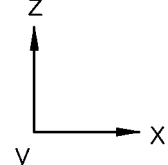

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Figure 1:
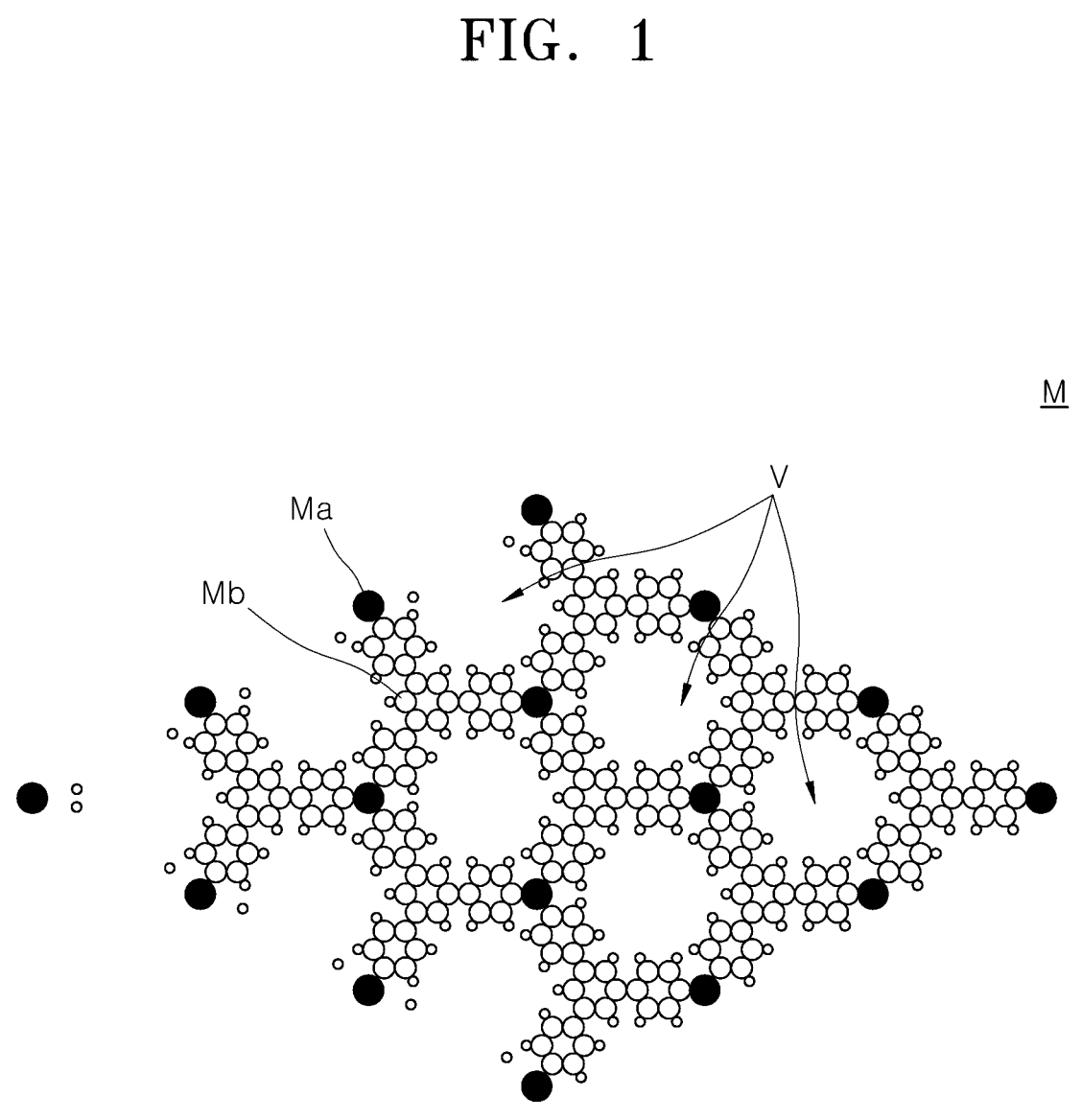

FIG. 1 is a schematic view schematically illustrating a metal-organic framework according to an embodiment of the present disclosure. In the present disclosed specification, a metal-organic framework M may refer to a porous material formed by coordinate bonds between a node Ma containing metal and organic ligands Mb. As an example, referring to FIG. 1, a metal-organic framework M may have a porous structure including cavities V. The node Ma containing metal may be, for example, a metal ion or a metal cluster. The metal may include, for example, magnesium (Mg), zinc (Zn), chromium (Cr), indium (In), gallium (Ga), copper (Cu), iron (Fe), molybdenum (Mo), cobalt (Co), ruthenium (Ru), manganese (Mn), lanthanum (La), titanium (Ti), hafnium (Hf), cadmium (Cd), zirconium (Zr), and the like. The organic ligand Mb may include, for example, oxalic acid, fumaric acid, benzenehexathiol, triphenylenehexathiol, 1,4-benzene dicarboxylic acid, hexaaminobenzene, tetrakis(4-carboxyphenyl)-porphyrinato-cobalt(II), tetrakis(4-carboxyphenyl)-porphyrin, 1,4-dioxido-2,5-benzenedicarboxylate, and the like. The organic ligand Mb may include, for another example, $H_2BDC$, $H_2BDC\text{-}Br$, $H_2BDC\text{-}OH$, $H_2BDC\text{-}NO_2$, $H_2BDC\text{-}NH_2$, $H_4DOT$, $H_2BDC\text{-}(Me)_2$, $H_2BDC\text{-}(Cl)_2$, and the like.

In the present specification, the metal-organic framework M may have electrical conductivity or semiconductor characteristics, and the cavities V of the metal-organic framework M may accommodate metal ions. In addition, when an external voltage is applied, conduction occurs through the metal ions and the cavities V.

Figure 3:
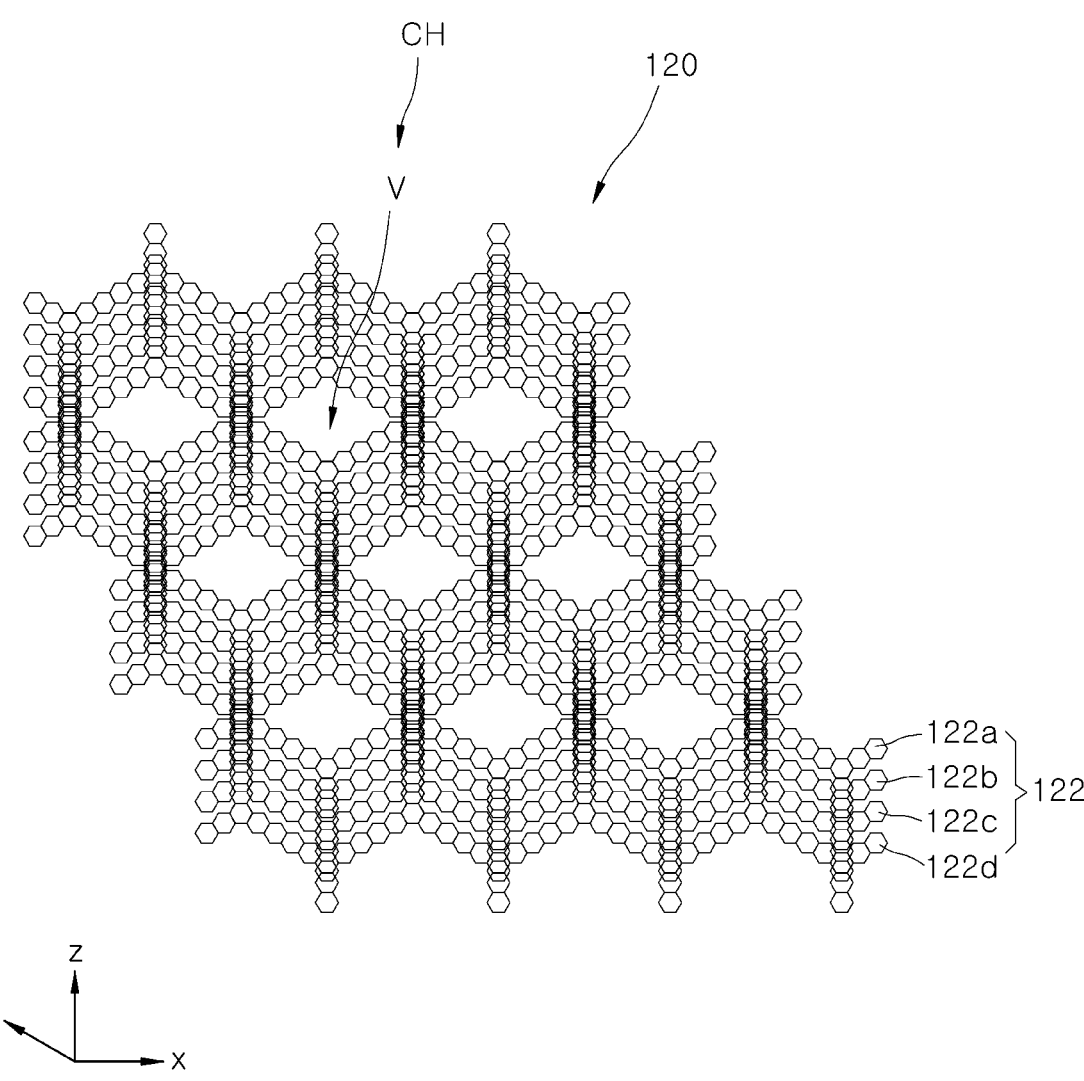
FIG. 3 is a perspective view schematically illustrating a resistance change layer of a semiconductor device according to an embodiment of the present disclosure.
Figure 4:
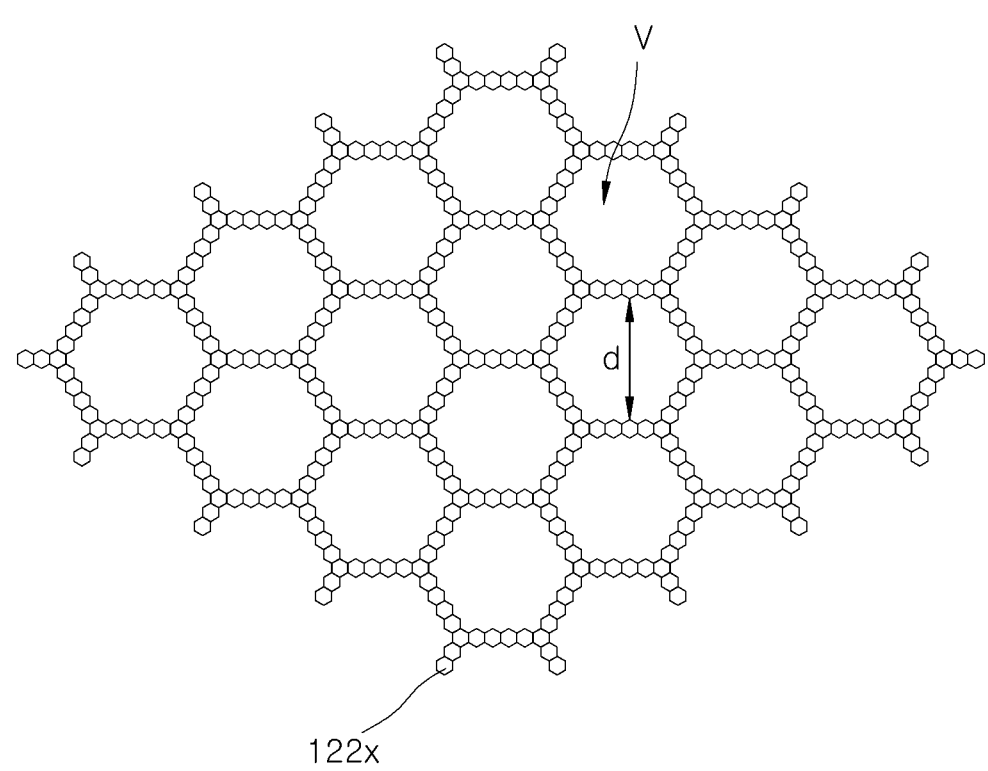
FIG. 4 is a plan view schematically illustrating a metal-organic framework of a resistance change layer according to an embodiment of the present disclosure.
Figure 4:
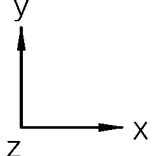

FIG. 2 is a cross-sectional view schematically illustrating a semiconductor device according to an embodiment of the present disclosure. FIG. 3 is a perspective view schematically illustrating a resistance change layer of a semiconductor device according to an embodiment of the present disclosure. FIG. 4 is a plan view schematically illustrating a metal-organic framework of a resistance change layer according to an embodiment of the present disclosure.

Referring to FIG. 2, a semiconductor device 1 may include a first electrode 110 and a second electrode 130 that are spaced apart from each other in a z-direction, and a resistance change layer 120 disposed between the first and second electrodes 110 and 130. The resistance change layer 120 may have an electrical resistance that changes according to a voltage applied between the first and second electrodes 110 and 130. The resistance change layer 120 may include a metal-organic framework layer 122.

In an embodiment, the semiconductor device 1 may be a resistance change memory device that uses a change in electrical resistance of the resistance change layer 120 to store signal information. As will be described later, the change in electrical resistance of the resistance change layer 120 may occur by formation and disconnection of conductive filaments in the channels CH disposed in the cavities of the metal-organic framework layer 122.

Referring to FIG. 2, each of the first and second electrodes 110 and 130 may include a conductive material. In an embodiment, each of the first and second electrodes 110 and 130 may include metal. When an external voltage is applied, one of the first and second electrodes 110 and 130 may provide metal ions having a positive charge, through an oxidation reaction, to the resistance change layer 120. The metal ions may include for example copper ions or silver ions. Accordingly, one of the first or second electrode providing the metal ions may include copper (Cu) or silver (Ag). The other of the first and second electrodes 110 and 130 may include an inert metal. The inert metal may include for example gold (Au) or platinum (Pt).

The resistance change layer 120 may include a metal-organic framework layer 122. In an embodiment, metal-organic framework layer 122 may be disposed to form a first interface 110S and a second interface 120S with the first electrode 110 and the second electrode 130, respectively.

The metal-organic framework layer 122 may include a plurality of metal-organic frameworks stacked in a width direction (i.e., the z-direction). FIG. 3 illustrates first to fourth metal-organic frameworks 122a, 122b, 122c, and 122d, which are stacked in the width direction, as an example. In FIG. 3, each of the first to fourth metal-organic frameworks 122a, 122b, 122c, and 122d may have substantially the same structure. In FIG. 4, a metal-organic framework 122x is illustrated as an example of the metal-organic frameworks included in the metal-organic framework layer 122. For example, the configuration of the metal-organic framework 122x may be substantially the same as that of each of the first to fourth metal-organic frameworks 122a, 122b, 122c, and 122d of FIG. 3.

Referring to FIG. 4, the metal-organic framework 122x may be a material having a two-dimensional structure including cavities V. Here, a two-dimensional structure may mean a sheet-shaped structure disposed on a two-dimensional plane. The cavities V may be arranged or spaced apart at regular intervals in the x-direction and the y-direction, and a width d of each of the cavities V may be, for example, about 1 nm to 100 nm. The width d of each of the cavities V may be controlled to various sizes according to the types of metal node and organic ligands constituting the metal-organic framework 122x. The metal-organic framework 122x may have electrical conductivity or semiconductor characteristics.

The two-dimensional metal-organic framework 122x may have a physically and chemically stable two-dimensional network bonding structure. That is, in the metal-organic framework 122x, the coordinate bonds between the metal node and the organic ligands may be regularly formed in a two-dimensional manner. As a result, a metal-organic framework 122x may take the shape of a sheet having a nano-sized thickness.

Referring to FIG. 3 again, in the metal-organic framework layer 122, when the first to fourth metal-organic frameworks 122a, 122b, 122c, and 122d are stacked, the cavities V of the first to fourth metal-organic frameworks 122a, 122b, 122c, and 122d may be disposed to overlap with each other in the z-direction. Accordingly, the metal-organic framework layer 122 may include channels CH that are formed by overlap of the cavities V along a thickness or width direction (i.e., z-direction). The channels CH may be disposed in the cavities aligned in the thickness or width direction.

Referring to FIG. 2 again, the channels CH may extend from the first electrode 110 to the second electrode 130 through the metal-organic framework layer 122. Referring to FIGS. 3 and 4, the plurality of cavities V of the metal-organic framework layer 122 may be spaced apart in the x-direction and the y-direction. As a result, each of the channels CH may be separated and spaced apart from each other. The channels CH may be substantially uniformly distributed within the metal-organic framework layer 122. As will be described later, the channels CH may accommodate the metal ions provided from one of the first and second electrodes 110 and 130. The metal ions may electrically conduct within the resistance change layer 120 through the channels CH.

Figure 5A:
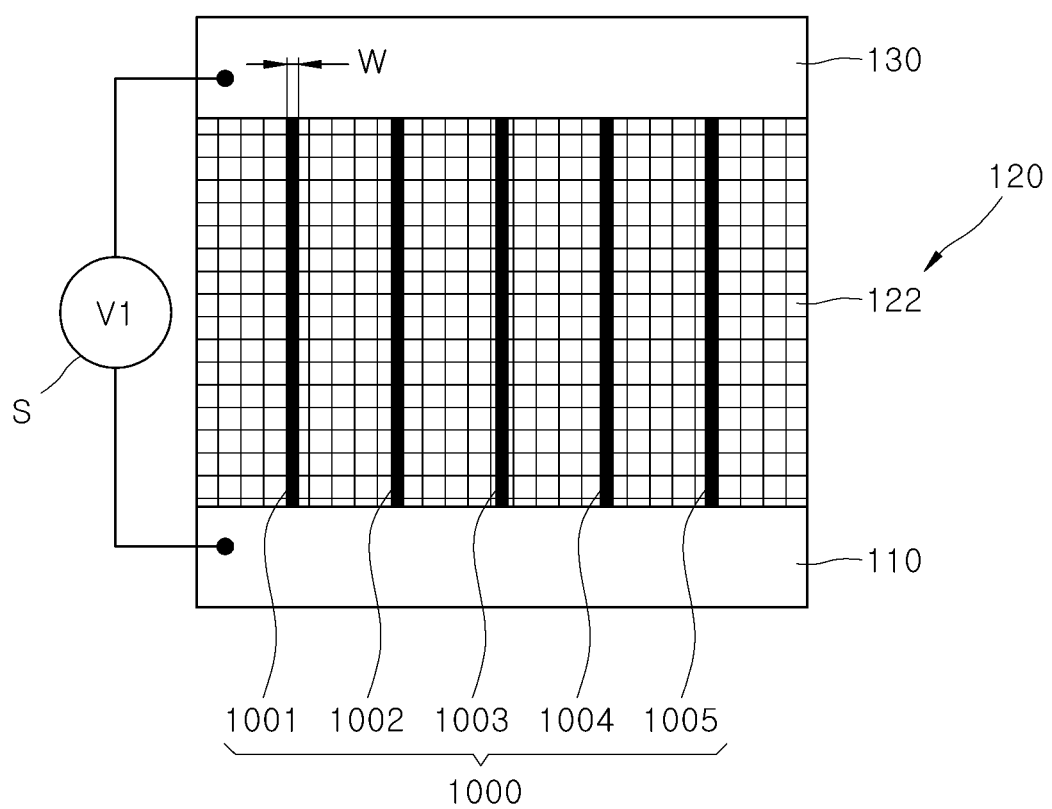
FIGS. 5A to 5C are views schematically illustrating an operation of a semiconductor device according to an embodiment of the present disclosure.
Figure 5B:
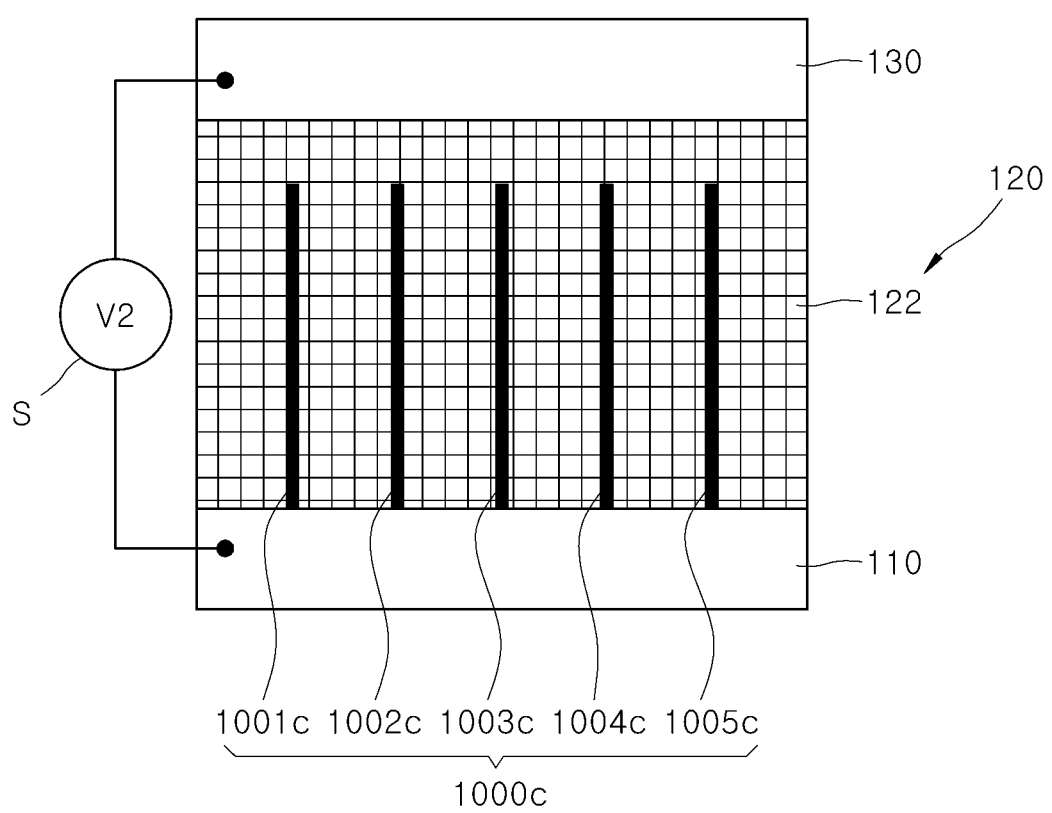
Figure 5C:
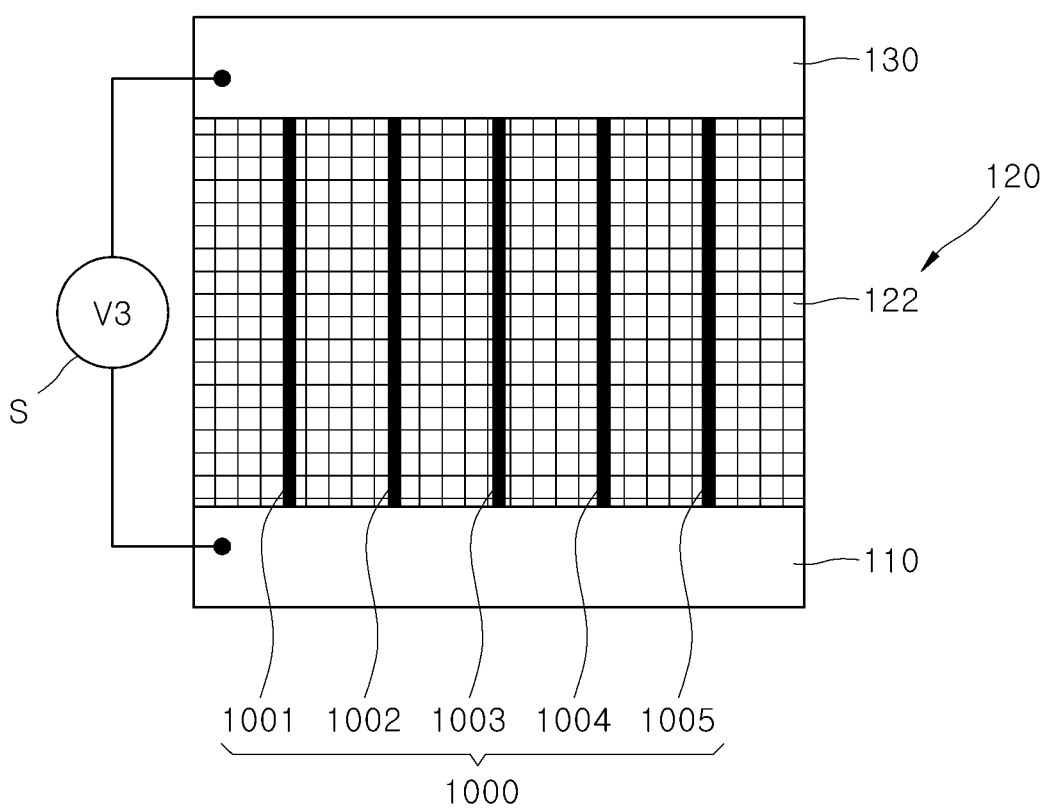

FIGS. 5A to 5C are views schematically illustrating an operation of a semiconductor device according to an embodiment of the present disclosure. The operation of a semiconductor device associated with FIGS. 5A to 5C will be described using a semiconductor device 1 described with reference to FIG. 1.

Referring to FIG. 5A, a first write operation may be performed on a semiconductor device 1. Specifically, the first write operation may be performed by applying a first write voltage V1 equal to or higher than a predetermined threshold voltage between the first electrode 110 and the second electrode 130 using a power supply S. The first write operation may be an operation of generating conductive filaments 1000 in the resistance change layer 120 to initially write a low resistance state immediately after the semiconductor device 1 is manufactured. The first write operation may be referred to as a forming operation of the semiconductor device 1.

In an embodiment, a method of applying the first write voltage V1 may be performed by applying a bias having a first polarity (e.g., a positive polarity) to the second electrode 130 in a state in which the first electrode 110 is grounded.

The first electrode 110 may include inert metal, and the second electrode 130 may include copper (Cu) or silver (Ag).

By the application of the first write voltage V1, metal ions may be provided from the second electrode 130 to the metal-organic framework layer 122 of the resistance change layer 120. As an example, the metal ions may be copper (Cu) ions or silver (Ag) ions. The metal ions may conduct in the metal-organic framework layer 122 through the channels CH, which are formed by a plurality of stacked cavities V of metal-organic frameworks. The metal ions may obtain electrons provided from the first electrode 110 and may be reduced to form the conductive filaments 1000. The conductive filaments 1000 within the metal-organic framework layer 122 may electrically connect the first electrode 110 to the second electrode 130, so the electrical resistance of the resistance change layer 120 may be reduced. The conductive filaments 1000 may remain in the metal-organic framework layer 122 even after the first write voltage V1 is removed, so that the resistance change layer 120 may store the state in which electrical resistance is reduced, that is, a low resistance state, as first signal information.

Referring to FIG. 5A, the conductive filaments 1000 may include a plurality of unit filaments 1001, 1002, 1003, 1004, and 1005. The plurality of unit filaments 1001, 1002, 1003, 1004, and 1005 may be respectively formed in channels CH in spaced apart cavities V of the metal-organic framework layer 122. Accordingly, the plurality of unit filaments 1001, 1002, 1003, 1004, and 1005 may be formed in spaced apart channels CH and may not contact each other.

A width W of each of the plurality of unit filaments 1001, 1002, 1003, 1004, and 1005 may be equal to or smaller than a width of each of the channels CH. The width of the channel CH of the cavities may correspond to a width d of the metal-organic framework 122d shown in FIG. 4. In relation to FIG. 5A, five unit filaments are described as the plurality of unit filaments 1001, 1002, 1003, 1004, and 1005, but the present disclosure is not necessarily limited thereto and the number of the unit filaments generated by the first write operation may vary in number.

As described above, the conductive filaments 1000 may be formed in the channels CH of the metal-organic framework layer 122, so that the width, density, and distribution of the conductive filaments 1000 may be substantially uniformly controlled. Accordingly, reliability of the first write operation by the first write voltage V1 may be improved.

Referring to FIG. 5B, a second write operation may be performed on the semiconductor device 1. Specifically, the second write operation may be performed by applying a second write voltage V2 equal to or higher than a predetermined threshold voltage between the first electrode 110 and the second electrode 130 of the semiconductor device 1 using the power supply S. The second write operation may be an operation of removing at least a portion of the conductive filaments 1000 that were generated inside the metal-organic framework layer 122 through the first write operation. The second write operation disconnects the electrical connection between the first and second electrodes 110 and 130. The second write operation may be referred to as a reset operation of the semiconductor device 1.

A method of applying the second write voltage V2 may be performed by applying a bias having a second polarity (e.g., negative polarity) to the second electrode 130 in a state in which the first electrode 110 is grounded. By the application of the second write voltage V2, at least a portion of the conductive filaments 1000 of FIG. 5A may be removed to form disconnected conductive filaments 1000c. FIG. 5B illustrates disconnected unit filaments 1001c, 1002c, 1003c, 1004c, and 1005c as the disconnected conductive filaments 1000c.

In an embodiment, the removal of at least a portion of the conductive filament 1000 may occur when the metal constituting the conductive filament 1000 is oxidized by the second write voltage V2. In another embodiment, the removal of at least a portion of the conductive filament 1000 may be caused by removing at least a portion of the conductive filament 1000 by Joule heat generated in the conductive filament 1000 by the second write voltage V2.

Referring to FIG. 5B, as a result of the second write operation, the electrical resistance of the resistance change layer 120 may increase through disconnection of at least a portion of the conductive filament 1000. Even after the second write voltage V2 is removed, the electrically disconnected conductive filaments 1000c may remain in the metal-organic framework layer 122. Accordingly, the resistance change layer 120 may store the increased electrical resistance state, that is, a high resistance state, as second signal information.

Referring to FIG. 5C, a third write operation may be performed on the semiconductor device 1. Specifically, the third write operation may be performed by applying a third write voltage V3 equal to or higher than a predetermined threshold voltage between the first electrode 110 and the second electrode 130 of the semiconductor device 1 using the power supply S. The third write operation may be an operation of reconnecting the disconnected portion of the disconnected conductive filaments 1000c resulting from the second write operation, which was a reset operation. The third write operation may be referred to as a set operation of the semiconductor device 1. Through this set operation, the electrical resistance of the resistance change layer 120 may be converted back to a low resistance state.

A method of applying the third write voltage V3 may proceed by applying a bias having the first polarity (e.g., a positive polarity) to the second electrode 130 in a state in which the first electrode 110 is grounded. In an embodiment, a level of the third write voltage V3 may be lower than a level of the first write voltage V1 of FIG. 5A.

By the application of the third write voltage V3, disconnected portions of the disconnected conductive filaments 1000c may be restored, and the conductive filament 1000 electrically connecting the first electrode 110 to the second electrode 130 may be formed again. Even after the third write voltage V3 is removed, the conductive filament 1000 may remain in the resistance change layer 120, so the resistance change layer 120 may store the low resistance state as the first signal information.

Figure 6:
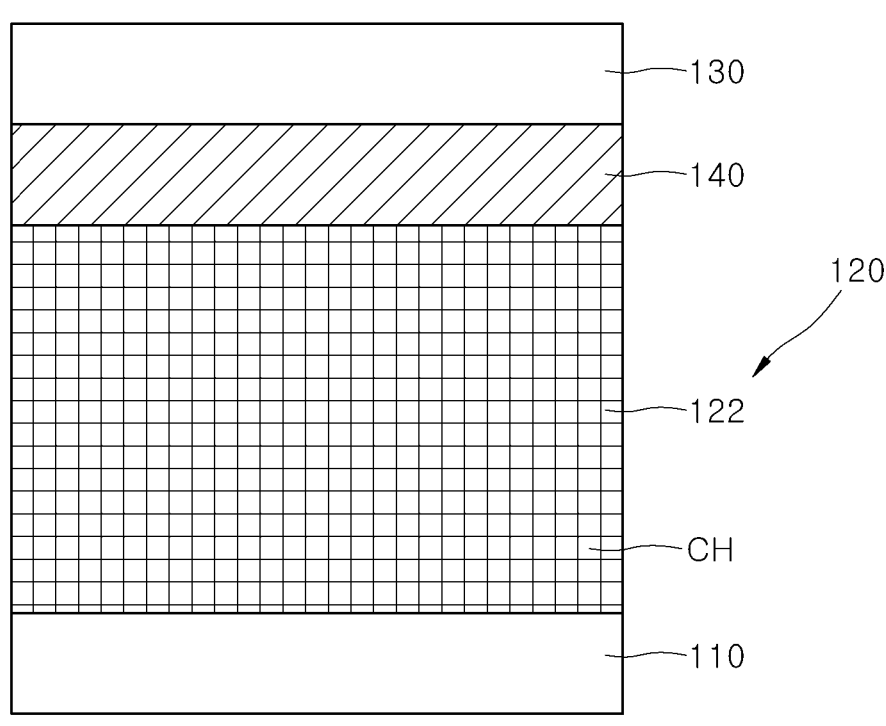
FIG. 6 is a cross-sectional view schematically illustrating a semiconductor device according to another embodiment of the present disclosure.
Figure 6:
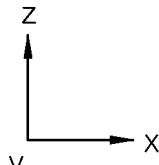

FIG. 6 is a cross-sectional view schematically illustrating a semiconductor device according to another embodiment of the present disclosure. Referring to FIG. 6, as compared to a semiconductor device 1 of FIG. 1, a semiconductor device 2 may further include an ion conduction layer 140 disposed between a resistance change layer 120 and a second electrode 130. In this case, the second electrode 130 may be an electrode providing metal ions to the resistance change layer 120.

Referring to FIG. 6, the ion conduction layer 140 may accommodate the metal ions provided from the second electrode 130 and may conduct the metal ions to the resistance change layer 120. The ion conduction layer 140 may improve the mobility of the metal ions toward the resistance change layer 120. The ion conduction layer 140 may have electrical conductivity for the metal ions. In an embodiment, the ion conduction layer 140 may include, for example, cationic exchange polymer, covalent-organic frameworks, sulfonated graphene, polymer-graphene composites, or a combination of two or more thereof.

Figure 7:
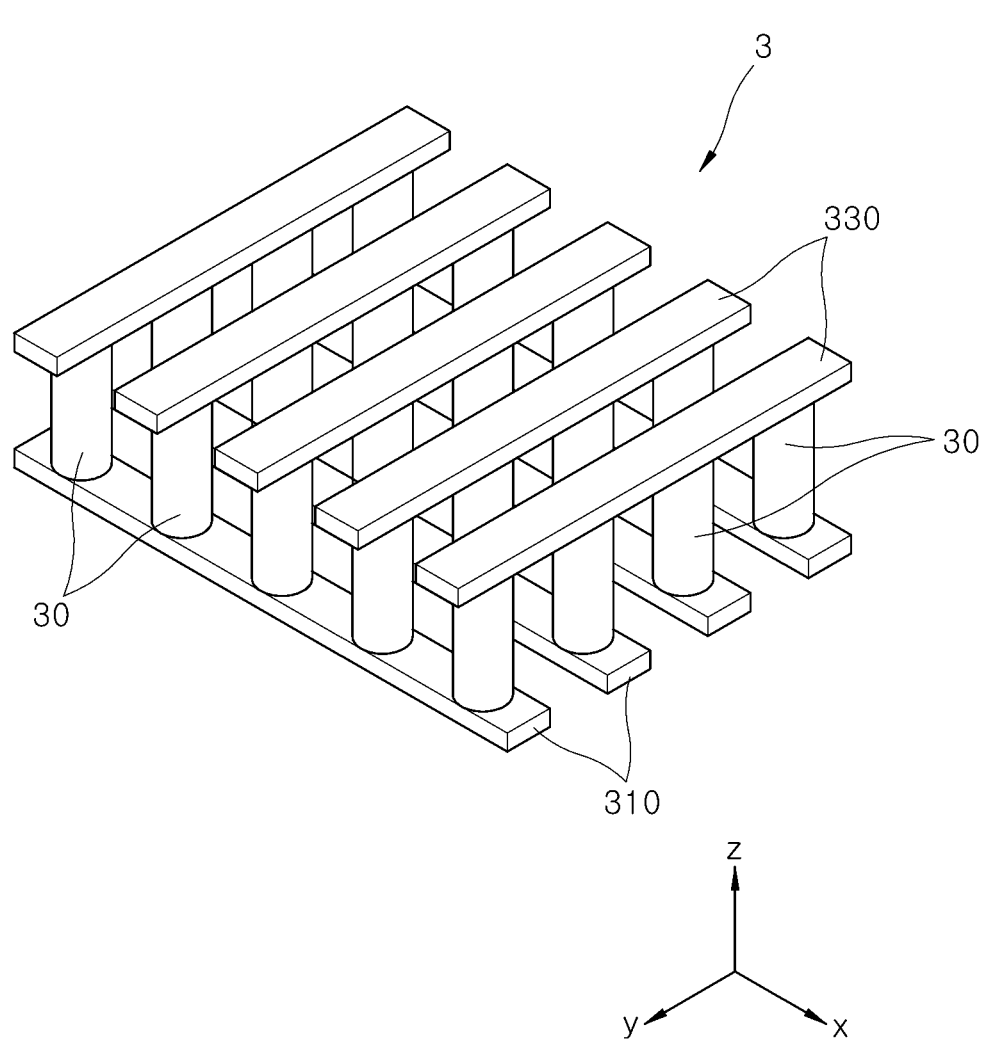
FIG. 7 is a perspective view schematically illustrating a semiconductor device according to further another embodiment of the present disclosure.
Figure 8:
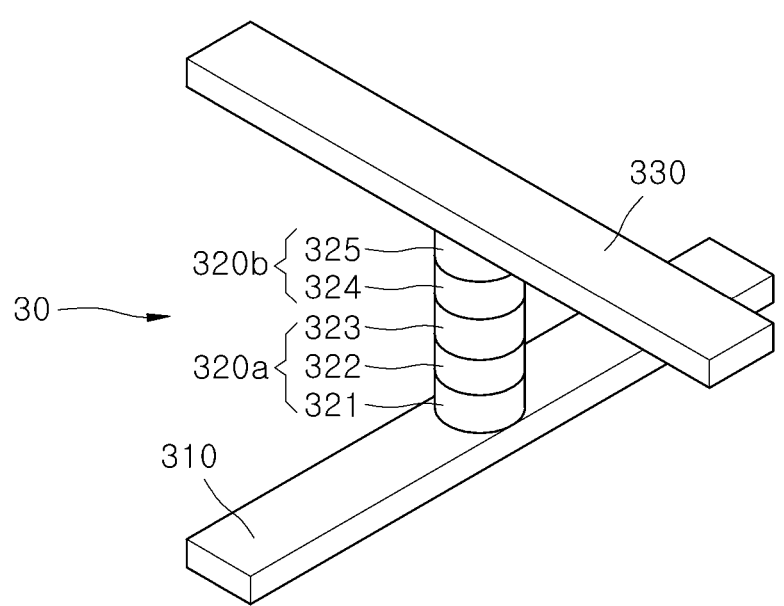
FIG. 8 is a partially enlarged view of a semiconductor device of FIG. 7.
Figure 8:
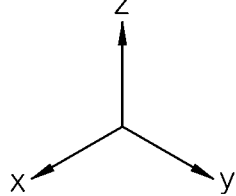

FIG. 7 is a perspective view schematically illustrating a semiconductor device according to another embodiment of the present disclosure. FIG. 8 is a partially enlarged view of a semiconductor device of FIG. 7.

Referring to FIGS. 7 and 8, a semiconductor device 3 may be a cross-point array device. The semiconductor device 3 may include first and second conductive lines 310 and 330, which are respectively disposed on different planes, and pillar structures 30 disposed in areas or regions where the first and second conductive lines 310 and 330 intersect. As illustrated in FIG. 8, each of the pillar structures 30 may include a memory element 320*a* and a selection element 320*b*.

Referring to FIG. 7, in the semiconductor device 3, the plurality of first conductive lines 310 may be arranged in the y-direction, and the plurality of second conductive lines 330 may be arranged in the x-direction. The plurality of pillar structures 30 may be disposed in the areas or regions where the plurality of first and second conductive lines 310 and 330 intersect. The plurality of pillar structures 30 may extend in the z-direction. In FIGS. 7 and 8, the x-direction and the y-direction are shown as orthogonal coordinate systems that are orthogonal to each other, but embodiments are not necessarily limited thereto, and various modifications may exist as long as the condition that the x-direction and the y-direction are non-parallel is satisfied. In FIGS. 7 and 8, the pillar structures 30 may constitute a plurality of arrays along the x-direction and the y-direction. Each of the plurality of pillar structures 30 may constitute a memory cell of the semiconductor device 3. The first and second conductive lines 310 and 330 may be signal lines of the semiconductor device 3 and may be line-shaped conductive layers.

Referring to FIG. 8, each of the pillar structures 30 may include the memory element 320*a* disposed on the first conductive line 310. The memory element 320*a* may include a first electrode 321, a resistance change layer 322, and a second electrode 323, which are sequentially disposed. The materials and electrical characteristics of the first electrode 321, the resistance change layer 322, and the second electrode 323 may be substantially the same as the materials and electrical characteristics of the first electrode 110, the resistance change layer 120, and the second electrode 130 of the semiconductor device 1 of FIG. 2, respectively. Specifically, one electrode of the first and second electrodes 321 and 323 may provide metal ions to the resistance change layer 322. The one electrode may include copper (Cu) or silver (Ag). The other electrode of the first electrode 321 and the second electrode 323 may include inert metal.

In addition, the pillar structure 30 may include the selection element 320*b* disposed on the memory element 320*a*. The selection element 320*b* may include a selection element layer 324 and a third electrode 325.

The selection element layer 324 may be a switching layer performing a threshold switching operation. The selection element layer 324 may perform a function of reducing a leakage current introduced from neighboring pillar structures when the cross-point array device operates. The selection element layer 324 may include, for example, silicon oxide, silicon nitride, metal oxide, metal nitride, or a combination of two or more thereof. For example, the selection element layer 324 may include aluminum oxide, zirconium oxide, hafnium oxide, tungsten oxide, titanium oxide, nickel oxide, copper oxide, manganese oxide, tantalum oxide, niobium oxide, or iron oxide. The third electrode 325 may include a conductive material. The conductive material may include metal, metal nitride, metal oxide, metal silicide, and the like.

In some embodiments not shown, the selection element 320*b* may be, for example, a diode, a tunnel barrier device, or an ovonic threshold switch.

As described above, semiconductor devices according to embodiments of the present disclosure may be implemented as a cross-point array device including a selection element performing a threshold switching operation and a memory element including a resistance change layer.

In some embodiments, the memory element 320*a* may further include an ion conduction layer (not illustrated) disposed between the resistance change layer 322 and the second electrode 323. The material and electrical characteristics of the ion conduction layer may be substantially the same as those of the ion conduction layer 140 of the semiconductor device 2 of FIG. 6.

In some embodiments, the selection element 320*b* may be omitted, and the second electrode 323 of the memory element 320*a* may be disposed to contact the second conductive line 330.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. A semiconductor device comprising:
   a first electrode and a second electrode that are spaced apart from each other; and
   a resistance change layer disposed between the first and second electrodes and including two-dimensional metal-organic frameworks having cavities,
   wherein the two-dimensional metal-organic frameworks are stacked in a thickness direction of the resistance change layer,
   wherein the resistance change layer comprises channels disposed in the cavities, the channels receiving metal ions provided from one electrode of the first and second electrodes,
   wherein cavities of the two-dimensional metal-organic frameworks are overlapped in the thickness direction to form the channels.

2. The semiconductor device of claim 1, wherein the metal ions conduct through the channels in the resistance change layer.

3. The semiconductor device of claim 1, wherein the channels extend from the first electrode to the second electrode.

4. The semiconductor device of claim 3, wherein the channels are uniformly distributed in the resistance change layer.

5. The semiconductor device of claim 3, wherein the resistance change layer further includes conductive filaments in the channels generated by reduction of the metal ions.

6. The semiconductor device of claim 5, wherein the resistance change layer has one of a low resistance state in which the first and second electrodes are electrically connected to each other by the conductive filaments and a high resistance state in which electrical connection between the first and second electrodes is blocked by disconnection of at least a portion of the conductive filaments.

7. The semiconductor device of claim 5, wherein a width of the conductive filament is equal to or smaller than a width of the channels.

8. The semiconductor device of claim 1, wherein the metal ions include copper (Cu) ions or silver (Ag) ions.

9. The semiconductor device of claim 1,
wherein the one electrode of the first and second electrodes includes copper (Cu) or silver (Ag), and
wherein the other electrode of the first and second electrodes includes gold (Au) or platinum (Pt).

10. The semiconductor device of claim 1, further comprising an ion conduction layer, having electrical conductivity for the metal ions, disposed between the resistance change layer and one of the first and second electrodes.

11. A semiconductor device comprising:
first and second conductive lines that are disposed on different planes; and
a pillar structure disposed in a region where the first and second conductive lines intersect, the pillar structure including a first electrode, a resistance change layer including two-dimensional metal-organic frameworks having cavities, and a second electrode,
wherein the two-dimensional metal-organic frameworks are stacked in a thickness direction of the resistance change layer,
wherein the resistance change layer comprises channels disposed in the cavities, the channels receiving metal ions provided from one electrode of the first and second electrodes, wherein cavities of the two-dimensional metal-organic frameworks are overlapped in the thickness direction to form the channels.

12. The semiconductor device of claim 11, wherein the metal ions conduct in the resistance change layer through the channels.

13. The semiconductor device of claim 11, wherein the channels extend from the first electrode to the second electrode.

14. The semiconductor device of claim 13, wherein the channels are uniformly distributed in the resistance change layer.

15. The semiconductor device of claim 13, wherein the resistance change layer further includes conductive filaments in the channels and generated by reduction of the metal ions.

16. The semiconductor device of claim 15, wherein a width of the conductive filament is equal to or smaller than a width of the channels.

17. The semiconductor device of claim 11, wherein the metal ions include copper (Cu) ions or silver (Ag) ions.

18. The semiconductor device of claim 11,
wherein the one electrode of the first and second electrodes includes copper (Cu) or silver (Ag), and
wherein the other electrode of the first and second electrodes includes gold (Au) or platinum (Pt).

19. The semiconductor device of claim 11, further comprising an ion conduction layer, having electrical conductivity for the metal ions, disposed between the resistance change layer and one of the first and second electrodes.

20. The semiconductor device of claim 11, wherein the pillar structure further includes a selection element that is electrically connected in series to one of the first and second electrodes.

* * * * *